United States Patent
Gunawardana et al.

(10) Patent No.: US 6,606,009 B2
(45) Date of Patent: Aug. 12, 2003

(54) SELF-COMPENSATING OVENIZED CLOCK ADAPTED FOR WELLBORE APPLICATIONS

(75) Inventors: Ruvinda Gunawardana, Sugar Land, TX (US); Cengiz Esmersoy, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 69 days.

(21) Appl. No.: 10/028,630

(22) Filed: Dec. 20, 2001

(65) Prior Publication Data

US 2002/0125966 A1 Sep. 12, 2002

Related U.S. Application Data

(60) Provisional application No. 60/274,627, filed on Mar. 8, 2001.

(51) Int. Cl.⁷ .................................................. H03L 1/00
(52) U.S. Cl. ......................... 331/176; 331/158; 331/66; 331/70
(58) Field of Search .................................. 331/176, 158, 331/66, 70, 44

(56) References Cited

U.S. PATENT DOCUMENTS

| 4,079,280 | A | 3/1978 | Kusters et al. |
|---|---|---|---|
| 5,004,987 | A | 4/1991 | Hurley |
| 5,041,800 | A | 8/1991 | Long et al. |
| 5,180,942 | A | 1/1993 | Marvin et al. |
| 5,473,289 | A | 12/1995 | Ishizaki et al. |
| 5,504,479 | A | 4/1996 | Doyle et al. |
| 5,525,936 | A | 6/1996 | Post et al. |
| 5,530,408 | A | 6/1996 | Vig et al. |
| 5,644,271 | A | 7/1997 | Mollov et al. |
| 5,668,506 | A | 9/1997 | Watanabe et al. |
| 5,729,181 | A | 3/1998 | Cutler et al. |
| 5,917,272 | A | 6/1999 | Clark et al. |
| 2002/0060952 | A1 | 5/2002 | Cecconi et al. |

FOREIGN PATENT DOCUMENTS

| EP | 1 130 418 | 9/2001 |
|---|---|---|
| GB | 2210746 A | 6/1989 |
| GB | 2220317 A | 1/1990 |
| GB | 2 348 023 | 9/2000 |

OTHER PUBLICATIONS

Search Report Under Section 17 for Great Britain Application No. GB0203982.4, Aug. 22, 2002.

*Primary Examiner*—Robert Pascal
*Assistant Examiner*—Joseph Chang
(74) *Attorney, Agent, or Firm*—Victor H. Segura; Brigitte L. Jeffery

(57) ABSTRACT

A clock system is disclosed which includes a dual mode oscillator crystal having a first output having a frequency related to a temperature of the oscillator crystal and a second output having a frequency substantially stable with respect to temperature. The clock includes a temperature maintenance device. The temperature maintenance device and the oscillator crystal are disposed in a thermally insulated chamber. The clock includes a processor operatively coupled to the temperature maintenance device and the oscillator crystal. The processor is adapted to operate the temperature maintenance device so as to maintain a temperature of the chamber within a predetermined range. The processor is adapted to calculate a substantially constant frequency clock signal from the second output and a ratio of the frequency of the first output with respect to the frequency of the second output.

28 Claims, 4 Drawing Sheets

SELF-COMPENSATING OVENIZED CLOCK ADAPTED FOR WELLBORE APPLICATIONS

CROSS-REFERENCE TO RELATED APPLICATIONS

This present application claims the benefit of U.S. Provisional Application No. 60/274,627 filed Mar. 8, 2001.

BACKGROUND OF THE INVENTION

1. Field of the Invention

The invention relates generally to the field of oscillators or clocks used to control the timing of electronic devices. More particularly, the invention relates to the field of temperature stabilization techniques for clocks.

2. Background Art

Timing of operation of electronic devices, particularly digital devices, requires an accurate, frequency stable clock signal. Many such electronic devices are subjected to variations in ambient temperature during their operation. As is well known in the art, changes in ambient temperature affect the frequency of a typical oscillator, even highly stable quartz-crystal oscillators or clocks.

Various techniques have been developed to improve the frequency stability of a quartz clocks. One technique is to place the clock in a temperature controlled chamber. See, for example, U.S. Pat. Nos. 5,917,272, 5,729,181 and 5,180,942.

A second technique is to use a voltage controlled oscillator (VCO) which enables adjusting the frequency of the clock output to compensate for temperature variations. Typical VCO systems are described, for example, in U.S. Pat. Nos. 5,668,506 and 5,473,289. Generally speaking, VCO systems include a means for measuring temperature operatively coupled to the clock so that the clock frequency can be adjusted for temperature variations.

Another technique for clock frequency stabilization is using a so-called "dual more" oscillator. A dual mode oscillator includes a crystal that oscillates in two distinct modes. One mode is relatively frequency stable with respect to temperature, while the second mode is relatively temperature sensitive. The temperature sensitive mode is used to enable determining the temperature of the crystal, and that temperature determination is then used to adjust the frequency of the thermally stable mode for temperature variations. See for example, U.S. Pat. Nos. 5,525,936 and 4,079,280. To further improve the accuracy of a dual mode clock, one system includes having the clock in a temperature-controlled chamber. Such as system is disclosed in U.S. Pat. No. 5,004,987.

One application for highly temperature stable clocks is in well logging instruments and drilling instruments known collectively as measurement while drilling (MWD) systems. MWD systems known in the art include various types of sensors disposed in a drill collar. The drill collar is adapted to form part of a drilling tool assembly. The sensors in the MWD system make measurements related to various properties of earth formations surrounding a wellbore drilled through the earth by the drilling tool assembly, as well as various drilling parameter measurements. Typically, many of the measurements are recorded in some type of storage device disposed in the drill collar. An important part of the record of the measurements stored in the storage device is the precise time at which the measurement is made. The time record is typically correlated to a time/well depth record made at the earth's surface so that the recorded measurements may be recharacterized with respect to depth in the earth at which the measurements were made. It is important that the time record made by the instrument in the wellbore be as time-accurate as possible to avoid subsequent depth correlation errors.

Other applications for highly temperature stable clocks in well logging instruments include operating a telemetry system such as used in wireline conveyed well logging instruments. Telemetry systems are used to communicate measurements made by the instrument to a recording and interpretation system disposed at the earth's surface. See, for example, U.S. Pat. No. 5,504,479 issued to Doyle. As explained in that patent, typical well logging instruments are subjected to wide temperature variations during use, and as a result, the telemetry clock can change frequency.

Techniques known in the art for stabilizing clock frequency are not very practical for use in MWD or wireline logging instrument systems mainly because the instruments are subjected to wide temperature variations, and such temperature variations can take place over a relatively short period of time. Further, using an oven to control the temperature of the clock to a very high degree of precision has proven impractical for use in MWD and wireline well logging systems. What is needed, therefore, is a temperature stable clock for use in well logging systems that can maintain frequency stability under wide and/or rapid variations in ambient temperature.

SUMMARY OF THE INVENTION

One aspect of the invention is a clock system which includes a dual mode oscillator crystal having a first output having a frequency related to a temperature of the oscillator crystal and a second output having a frequency substantially stable with respect to temperature. The clock includes a temperature maintenance device. The temperature maintenance device and the oscillator crystal are disposed in a thermally insulated chamber. The clock includes a processor operatively coupled to the temperature maintenance device and the oscillator crystal. The processor is adapted to operate the temperature maintenance device so as to maintain a temperature of the chamber within a predetermined range. The processor is adapted to calculate a substantially constant frequency clock signal using the frequency of the second output and a ratio of the frequency of the first output with respect to the frequency of the second output.

In one embodiment, the processor is adapted to receive instructions characterizing a relationship of the frequency of the first output and the frequency of the second output with respect to a frequency of the second output over a selected temperature range. In another embodiment, the processor is adapted to operate the temperature maintenance device to cause the temperature of the oscillator crystal to pass through a selected operating range, and the processor is adapted to receive an external clock signal to characterize drift in a corrected frequency output of the clock with respect to the external clock signal and the temperature determined from measurement of the frequency of the first output and the frequency of the second output.

Other aspects and advantages of the invention will be apparent from the following description and the appended claims.

DETAILED DESCRIPTION

Figure 1:
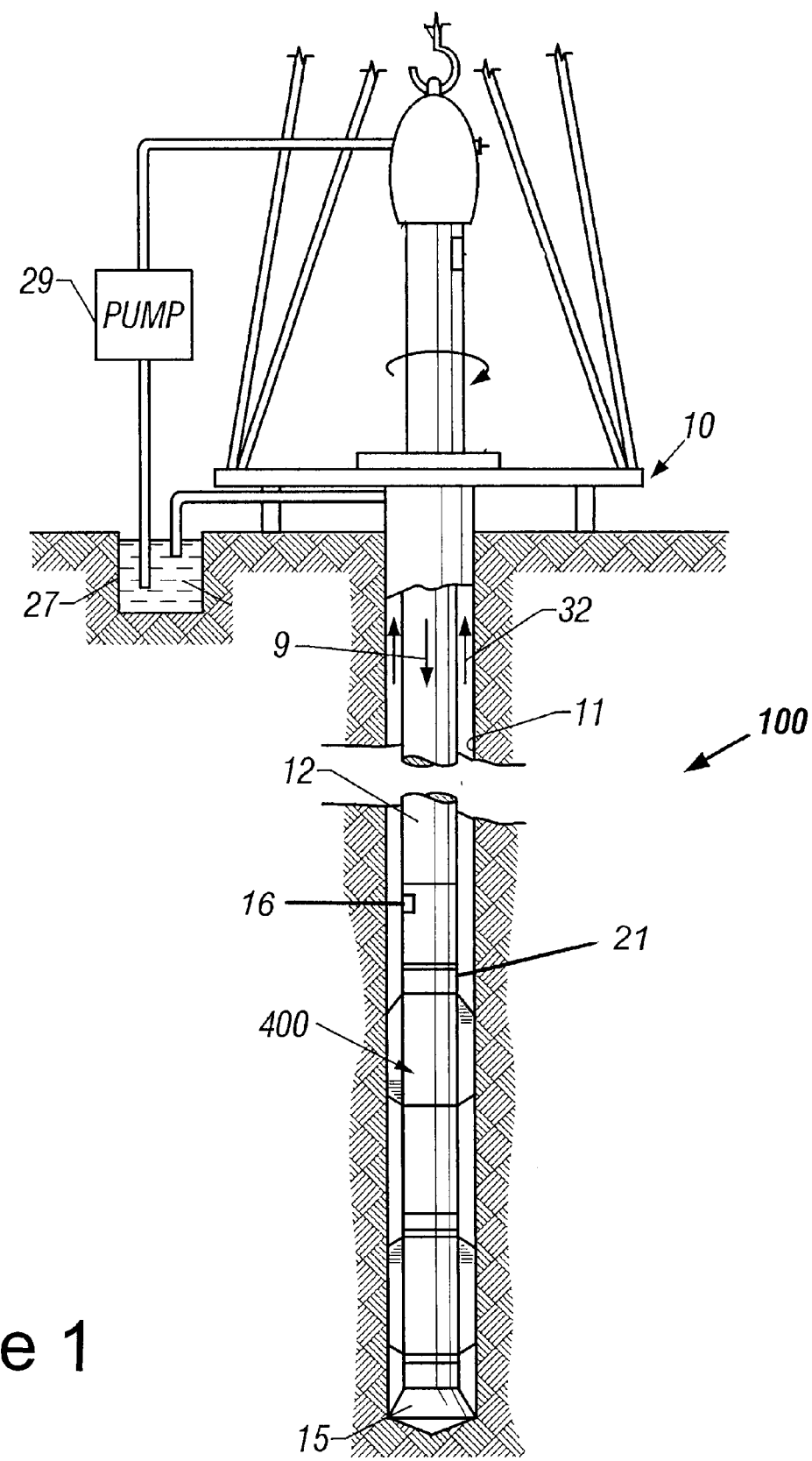
FIG. 1 shows a measurement while drilling system disposed in a wellbore to illustrate the general setting for using a clock system according to the invention.

An example of a typical application of a clock system according to the various aspects of the invention is shown generally in FIG. 1. A wellbore 11 is shown being drilled through the earth using a measurement while drilling (MWD) instrument system 100 including a drilling tool assembly 12. The wellbore 11 is drilled by a drilling rig 10 which raises and lowers the drilling tool assembly 12 out of and into the wellbore, while turning the drilling tool assembly 12. A drill bit 15 is coupled to the lower end of the drilling tool assembly 12. Mud pumps 29 at the rig 10 lift drilling mud from a tank or storage pit 27 and pump it through the interior 9 of the drilling tool assembly 12. The mud travels out from nozzles (not shown) in the bit 15, and returns to the surface in an annular space 32 between the outside of the drilling tool assembly 12 and the wall of the wellbore 11.

The MWD instrument system 100 can include one or more sensors 400 adapted to make measurements of one or more properties of the formations adjacent the wellbore 11, and/or one or more drilling parameters. Some of the measurements made by the sensors 400 may be recorded, with respect to time, in a storage device 16 in the MWD system 100, such as a digital memory. As will be readily appreciated by those skilled in the art, the temperature at the MWD instrument system 100 can vary over a wide range, depending on, among other factors, the depth in the wellbore 11, the temperature gradient of the earth local to the wellbore 11, the circulation rate of the drilling mud through the drilling tool assembly 12, and the rate at which the MWD system 100 is lowered into and withdrawn from the wellbore.

The time of recording, and other functions of electronic devices in the MWD system 100 are controlled by an oscillator crystal or clock system 21 disposed inside the MWD system 100.

While the foregoing setting of the use of a clock system according to the invention is explained with respect to MWD systems, it should be clearly understood that using a clock system according to the invention in an MWD system is not the only application for a clock system according to the invention. Other applications, such as in wireline-conveyed well logging instruments, or in other applications which require a very precise clock, are clearly within the scope of this invention.

Figure 2:
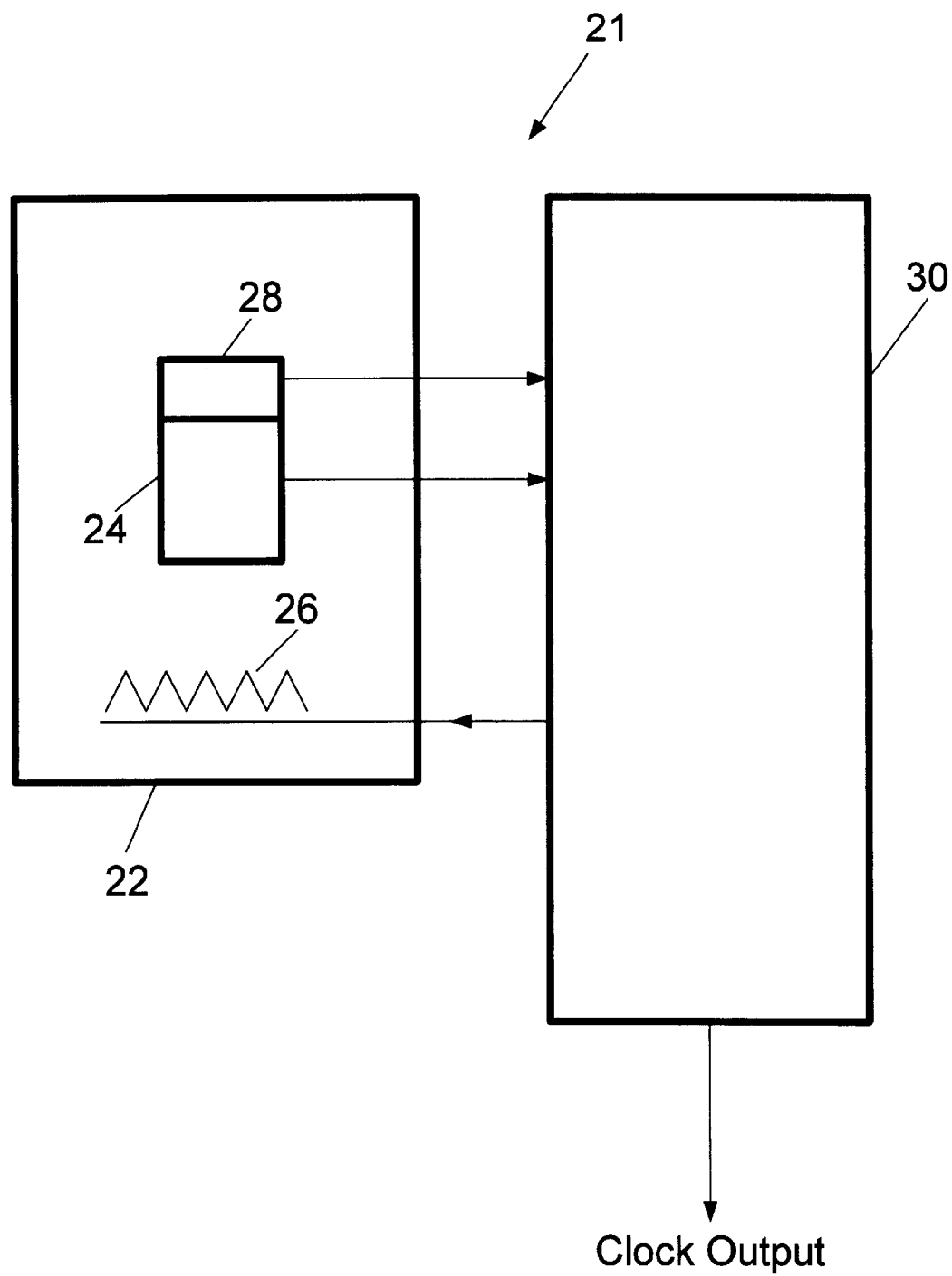
FIG. 2 shows an example of a clock system according to one aspect of the invention.

Having shown one example of a general setting of a clock system according to the invention, a clock system according to the invention is shown in FIG. 2. One embodiment of the clock system 21 includes a dual mode oscillator crystal 24, a temperature maintenance device, which in this embodiment is a heating element 26, and a temperature sensor 28 disposed in an insulated chamber 22. In this embodiment the insulated chamber 22 is a Dewar flask. The output of the dual mode oscillator crystal 24 is coupled to a processor 30, the operation of which will be further explained. The processor 30 controls operation of the heating element 26 to maintain the temperature, as sensed by the sensor 28, within a preselected range. The processor 30 calculates a substantially constant frequency clock signal from the frequency of one of the outputs of the dual mode oscillator crystal 24 in response to a predetermined characterization.

The embodiment shown in FIG. 2 includes the heating element 26 for the purpose of maintaining temperature inside the chamber 22 within a selected range, which will be further explained. An electrical heating element is only one example of a temperature maintenance device, which may be used in other embodiments of the invention. In embodiments of the invention, the temperature maintenance device is operatively controlled, such as by the processor 30, to maintain the temperature inside the chamber 22 within a selected range. The heating element 26, as will be further explained, has practical advantages over other types of temperature maintenance devices, but is not the only type of such device, which may be used in other embodiments of the invention.

A dual mode oscillator which can be used in embodiments of a clock system according to the invention is disclosed in U.S. Pat. No. 4,079,280 issued to Kusters et al., herein incorporated by reference. Various embodiments of the present invention make use of the particular characteristics of a dual mode oscillator crystal to maintain a clock signal output having very stable frequency. Dual mode oscillators have one output mode which is relatively frequency stable with respect to temperature, known as slow shear, or Fc. A second mode, known as fast shear, or Fb, has a frequency which varies nearly linearly with temperature. In embodiments of a clock system according to the invention, prior to use in a wellbore, the outputs Fc and Fb are characterized over the expected operating temperature range of the clock system 21. The characterization may be stored locally in the processor 30 to determine a clock signal from estimates of Fc and Fb. In one embodiment, a ratio Fb/Fc−1 is determined by counting oscillator output pulses of both outputs over a same time interval. This ratio is used to calculate a substantially constant frequency clock signal output from an estimate of Fc.

Figure 3:
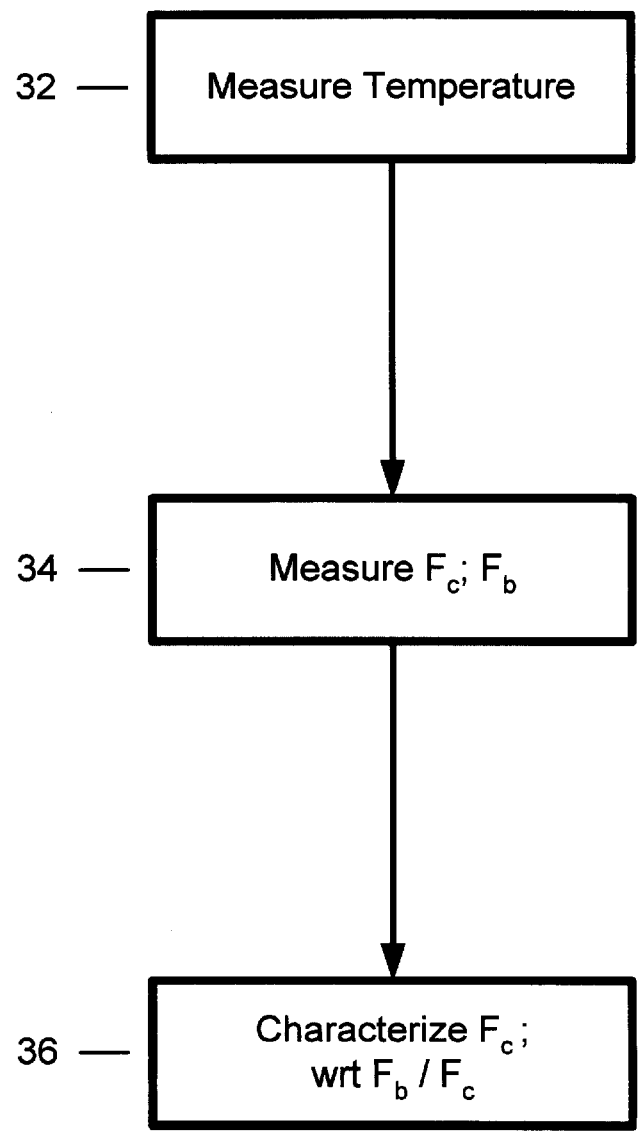
FIG. 3 shows a flow chart of initial characterization of the clock system with respect to temperature.

Characterization is shown in FIG. 3. The clock system 21 is placed in an oven and is subjected to a range of temperatures over which the clock system is likely to be exposed during operation. The temperature is measured during the characterization, as shown at 32. Output of the oscillator crystal (24 in FIG. 2) is then measured for each mode, Fb and Fc as shown at 34. In one embodiment, characterization of Fc is done, at 36, with respect to a ratio Fb/Fc. This characterization, as previously explained, may be stored in the processor (30 in FIG. 2). In one embodiment, the characterization of the ratio Fb/Fc−1 is performed by fitting the ratio to a fifth order polynomial expression with respect to measured temperature.

Figure 4:
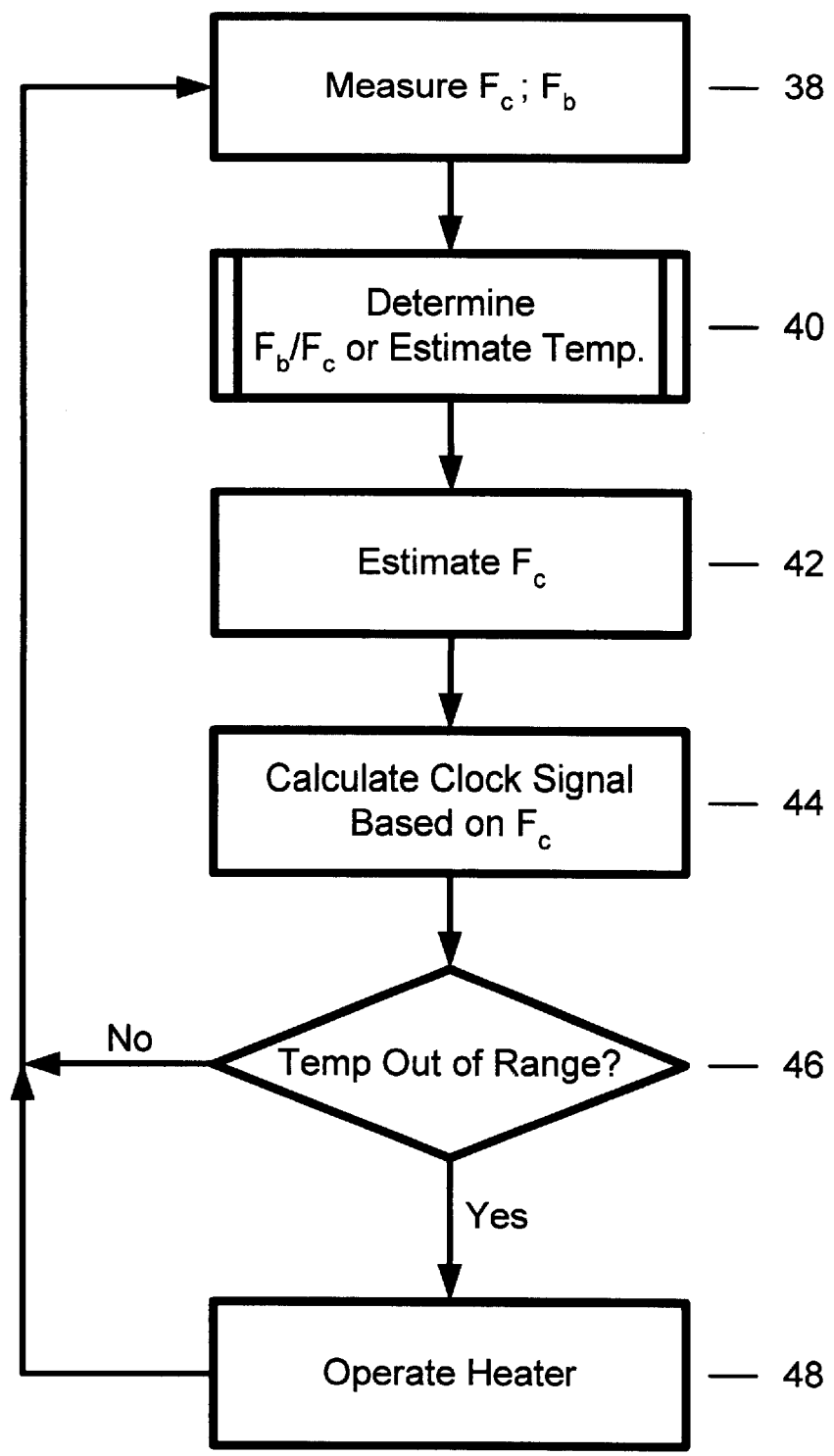
FIG. 4 shows a flow chart of an example of operating a clock and heating element according to one embodiment of the invention.

In a well logging instrument or MWD system, for example such as shown in FIG. 1, the clock system 21 operates as shown in FIG. 4. Oscillator crystal outputs Fb and Fc are measured, at 38, and a ratio of Fb to Fc is determined, at 40, for example, by determining a number of Fb pulses over a same time interval as a selected number of Fc clock pulses is counted. A ratio of frequencies Fb to Fc may thus be determined without the need to explicitly determine the frequency of outputs Fb and Fc. Alternatively, a temperature estimation may be made. The characterization stored in the processor at 42 is then used by the processor (30 in FIG. 2) to estimate Fc, at 42, and to calculate a substantially constant clock frequency output, at 44, from the Fc oscillator crystal output.

In embodiments of the invention, a selected range of expected operating temperatures is programmed into the processor (30 in FIG. 2) or otherwise communicated to the processor (30 in FIG. 2). As shown at 46, if the temperature measured by the sensor is within the selected range, no action is taken with respect to the heater (22 in FIG. 2). If the temperature in the chamber (22 in FIG. 2) is outside the programmed range, the heater (heating element 26 in FIG. 2) can be operated, such as by turning on or off, to return the temperature in the chamber (22 in FIG. 2) to within the selected range, shown at 48.

The selected range of temperatures may be different for each operation of the clock system, depending on the conditions at the particular wellbore, as will be readily appreciated by those skilled in the art. Typically, the selected temperature range will be somewhat higher than a maximum expected temperature in the wellbore so that it is only necessary to provide a heating element rather than a cooling system to maintain temperature in the chamber (22 in FIG. 2). However, if cooling is desired, the temperature maintenance device may be configured to lower the temperature as known in the art. It has been determined that maintaining the clock temperature within relatively a narrow range reduces the effect of hysteresis and non-repeatability on the temperature dependency of Fc and Fb.

In some embodiments, a well logging tool clock using a clock system according to the invention may be synchronized to a GPS clock signal upon initially powering up the logging tool. After the chamber has reached the selected operating temperature, phase and frequency of the tool clock can be compared to the GPS clock signal. Any differences in phase and or frequency of the clock signal output can be corrected by adjusting the programming of the processor (30 in FIG. 2) so that the clock signal matches the phase and frequency of the GPS clock signal.

Advantageously, embodiments of the invention can maintain a substantially constant clock frequency for operating electronic systems without the need to maintain clock temperature constant to a high degree of precision, or to explicitly determine the temperature of the oscillator crystal. Advantageously, embodiments of the invention provide a highly frequency-stable clock signal, which may be better able to resist rapid changes in clock temperature.

In another aspect of the invention, the clock system can be recalibrated without the need to remove it from the well logging instrument. The clock system may be initially calibrated as explained with respect to FIGS. 3 and 4. As the clock system is used, the components of the oscillator crystal (24 in FIG. 2) may undergo some response shift as a result of aging. In this embodiment, the system can be recalibrated by comparing the clock output (see FIG. 2) to an external clock signal such as a global positioning system (GPS) satellite clock signal. Comparison of the clock output is performed while the heating element (26 in FIG. 2) is operated to cause the temperature in the chamber (22 in FIG. 20 to pass through the entire range used during the initial calibration. Any variations in the clock output (see FIG. 2) as detected by comparison with the GPS clock signal are then used to adjust the characterization to compensate for any drift in the clock output such as caused by aging.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A clock system, comprising:
    a dual mode oscillator crystal having a first output having a frequency related to a temperature of the oscillator crystal and a second output having a frequency substantially stable with respect to temperature;
    a temperature maintenance device, the temperature maintenance device and the oscillator crystal disposed in a thermally insulated chamber; and
    a processor operatively coupled to the temperature maintenance device and the oscillator crystal, the processor adapted to operate the temperature maintenance device so as to maintain a temperature of the chamber within a predetermined range, the processor adapted to calculate a substantially constant frequency clock signal output from the frequency of the second output and a ratio of the frequency of the first output with respect to the frequency of the second output.

2. The clock system as defined in claim 1 wherein the chamber comprises a Dewar flask.

3. The clock system as defined in claim 1 wherein the processor is adapted to receive instructions characterizing a relationship of the frequency of the first output and the frequency of the second output with respect to a frequency of the second output over a selected temperature range.

4. The clock system as defined in claim 1 wherein the processor is adapted to operate the temperature maintenance device to cause the temperature of the oscillator crystal to pass through a selected operating range, and the processor is adapted to receive an external clock signal to characterize drift in the clock signal output with respect to the external clock signal.

5. The clock system as defined in claim 4 wherein the external clock signal comprises a global positioning system clock signal.

6. The clock system as defined in claim 1 wherein the processor is adapted to receive an external clock signal to synchronize the clock signal output to the external clock signal upon initialization of the clock system.

7. The clock system as defined in claim 6 wherein the external clock signal comprises a global positioning system clock signal.

8. The clock system as defined in claim 1 wherein the temperature maintenance device comprises a heating element.

9. The clock system as defined in claim 8 wherein a lowermost temperature in the predetermined range is at least equal to a maximum expected temperature to which the clock system will be exposed.

10. A well logging instrument comprising:
    a sensor adapted to measure at least one of a drilling parameter and a formation characteristic; and
    at least one of a telemetry system and a storage device operatively coupled to the sensor, the telemetry system or the storage device operatively coupled to a clock system, the clock system comprising a dual mode oscillator crystal having a first output having a frequency related to a temperature of the oscillator crystal and a second output having a frequency substantially stable with respect to temperature, a temperature maintenance device, the temperature maintenance device and the oscillator crystal disposed in a thermally insulated chamber, and a processor operatively coupled to the temperature maintenance device and the oscillator crystal, the processor adapted to operate the temperature maintenance device so as to maintain a temperature of the chamber within a predetermined range, the processor adapted to calculate a substantially constant frequency clock signal from the second output and from a ratio of the frequency of the first output with respect to the frequency of the second output.

11. The well logging instrument as defined in claim 10 wherein the chamber comprises a Dewar flask.

12. The well logging instrument as defined in claim 10 wherein the processor is adapted to receive instructions characterizing a relationship of a ratio of the frequency of the first output and the frequency of the second output with respect to the frequency of the second output over a selected temperature range.

13. The well logging instrument as defined in claim 10 wherein the processor is adapted to operate the temperature maintenance device to cause the temperature of the oscillator crystal to pass through a selected operating range, and the processor is adapted to receive an external clock signal to characterize drift in the calculated clock signal with respect to the external clock signal.

14. The well logging instrument as defined in claim 13 wherein the external clock signal comprises a global positioning system clock signal.

15. The well logging instrument as defined in claim 10 wherein the processor is adapted to receive an external clock signal to synchronize the clock signal output to the external clock signal upon initialization of the clock system.

16. The well logging instrument as defined in claim 15 wherein the external clock signal comprises a global positioning system clock signal.

17. The well logging instrument as defined in claim 10 wherein the temperature maintenance device comprises an electric heating element.

18. The well logging instrument as defined in claim 17 wherein a lowermost temperature in the predetermined range is at least equal to a maximum expected temperature in a wellbore in which the logging instrument is to be operated.

19. The well logging instrument as defined in claim 10 wherein the sensor and the clock system are disposed in a drill collar forming part of a measurement while drilling system.

20. A method for generating a clock signal having frequency substantially unaffected by ambient temperature, comprising:

resonating a crystal in a first mode, a frequency of which is related to temperature;

simultaneously resonating the crystal in a second mode, a frequency of which is substantially independent of temperature;

determining a ratio of the first mode frequency and the second mode frequency;

calculating the clock signal from the second mode frequency and a predetermined characterization of the second mode frequency with respect to the ratio over a selected temperature range.

21. The method as defined in claim 20 wherein the predetermined characterization is performed over an expected operating temperature range of the clock system.

22. The method as defined in claim 20 wherein the characterization comprises fitting the ratio and the frequency of the second output to a fifth order polynomial expression.

23. The method as defined in claim 20 further comprising operating a temperature maintenance device to cause the temperature of the crystal to pass through the selected operating range; comparing the calculated clock signal to an external clock signal; and adjusting the characterization with respect to temperature to account for differences between the calculated clock signal and the external clock signal.

24. The method as defined in claim 23 wherein the external clock signal comprises a global positioning system clock signal.

25. The method as defined in claim 23 wherein the temperature maintenance device comprises a heating element.

26. The method as defined in claim 20 further comprising maintaining a temperature of a chamber in which the crystal is disposed within a preselected range having a lowermost temperature at least equal to an uppermost expected operating temperature of a well logging instrument.

27. The method as defined in claim 20 further comprising synchronizing the calculated clock signal to an external clock signal upon initially resonating the crystal.

28. The method as defined in claim 27 wherein the external clock signal comprises a global position system clock signal.

* * * * *